United States Patent
Lin et al.

(10) Patent No.: US 9,928,137 B2
(45) Date of Patent: Mar. 27, 2018

(54) DATA STORAGE DEVICE AND ERROR CORRECTION METHOD

(71) Applicant: Silicon Motion, Inc., Jhubei (TW)

(72) Inventors: I-Hung Lin, Zhubei (TW); Wei-Lun Yen, Tainan (TW)

(73) Assignee: Silicon Motion, Inc., Jhubei (TW)

( * ) Notice: Subject to any disclaimer, the term of this patent is extended or adjusted under 35 U.S.C. 154(b) by 93 days.

(21) Appl. No.: 14/951,025

(22) Filed: Nov. 24, 2015

(65) Prior Publication Data
US 2016/0239382 A1 Aug. 18, 2016

(30) Foreign Application Priority Data
Feb. 12, 2015 (TW) .............................. 104104676 A

(51) Int. Cl.
G11C 29/00 (2006.01)
G06F 11/10 (2006.01)
G11C 29/04 (2006.01)

(52) U.S. Cl.
CPC .. G06F 11/1048 (2013.01); *G11C 2029/0411* (2013.01)

(58) Field of Classification Search
CPC .................. G06F 11/1048; G11C 2029/0411
See application file for complete search history.

(56) References Cited

U.S. PATENT DOCUMENTS

| 8,225,175 | B2 | 7/2012 | Chen et al. | |
| 8,898,548 | B1* | 11/2014 | Mullendore | H03M 13/353 365/185.09 |
| 9,720,769 | B2* | 8/2017 | Manohar | G06F 11/1048 |
| 2011/0191651 | A1* | 8/2011 | Chen | H03M 13/29 714/755 |

OTHER PUBLICATIONS

Office Action of corresponding TW application, published on Jun. 20, 2016.

* cited by examiner

*Primary Examiner* — Guy Lamarre
(74) *Attorney, Agent, or Firm* — Wang Law Firm, Inc.

(57) ABSTRACT

A data storage device includes a flash memory and a controller. The flash memory includes a plurality of dies, and each of the dies includes a first memory plane and a second memory plane, wherein the first memory plane includes a plurality of pages and the second memory plane includes a plurality of pages. The controller corrects data stored in the first memory plane and the second memory plane according to an ECC capability table, wherein the ECC capability table is arranged to record a first ECC capability value of the first memory plane and a second ECC capability value of the second memory plane.

11 Claims, 6 Drawing Sheets

DATA STORAGE DEVICE AND ERROR CORRECTION METHOD

CROSS REFERENCE TO RELATED APPLICATIONS

This Application claims priority of Taiwan Patent Application No. 104104676, filed on Feb. 12, 2015, the entirety of which is incorporated by reference herein.

BACKGROUND OF THE INVENTION

Field of the Invention

The present invention relates to a data-storage device, and in particular to a data-storage device capable of accessing different dies with different error-correction abilities.

Description of the Related Art

Flash memory is considered a non-volatile data-storage device, using electrical methods to erase and program itself. NAND Flash, for example, is often used in memory cards, USB flash devices, solid state devices, eMMCs, and other memory devices.

In the production process for flash memories, all of the memory cells (pages) of a column of a flash memory might not be successfully accessed due to dust or masking issues. Traditionally, the number of bad columns may be detected by scanning the flash memory. However, the error correction ability will be affected when the number of bad columns is too high.

BRIEF SUMMARY OF THE INVENTION

A detailed description is given in the following embodiments with reference to the accompanying drawings.

The present invention provides a data storage device. The data storage device includes a flash memory and a controller. The flash memory includes a plurality of dies, and each of the dies includes a first memory plane and a second memory plane, wherein the first memory plane includes a plurality of pages and the second memory plane includes a plurality of pages. The controller corrects data stored in the first memory plane and the second memory plane according to an ECC capability table, wherein the ECC capability table is arranged to record a first ECC capability value of the first memory plane and a second ECC capability value of the second memory plane.

The present invention also provides an error correction method applied to a data storage device. The data storage device includes a flash memory, which includes a plurality of dies, and each of the dies includes a first memory plane and a second memory plane, wherein each of the first memory plane and the second memory plane includes a plurality of pages. The error correction method includes correcting data of at least one page of the first memory plane according to a first ECC capability value; and correcting data of at least one page of the second memory plane according to a second ECC capability value.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
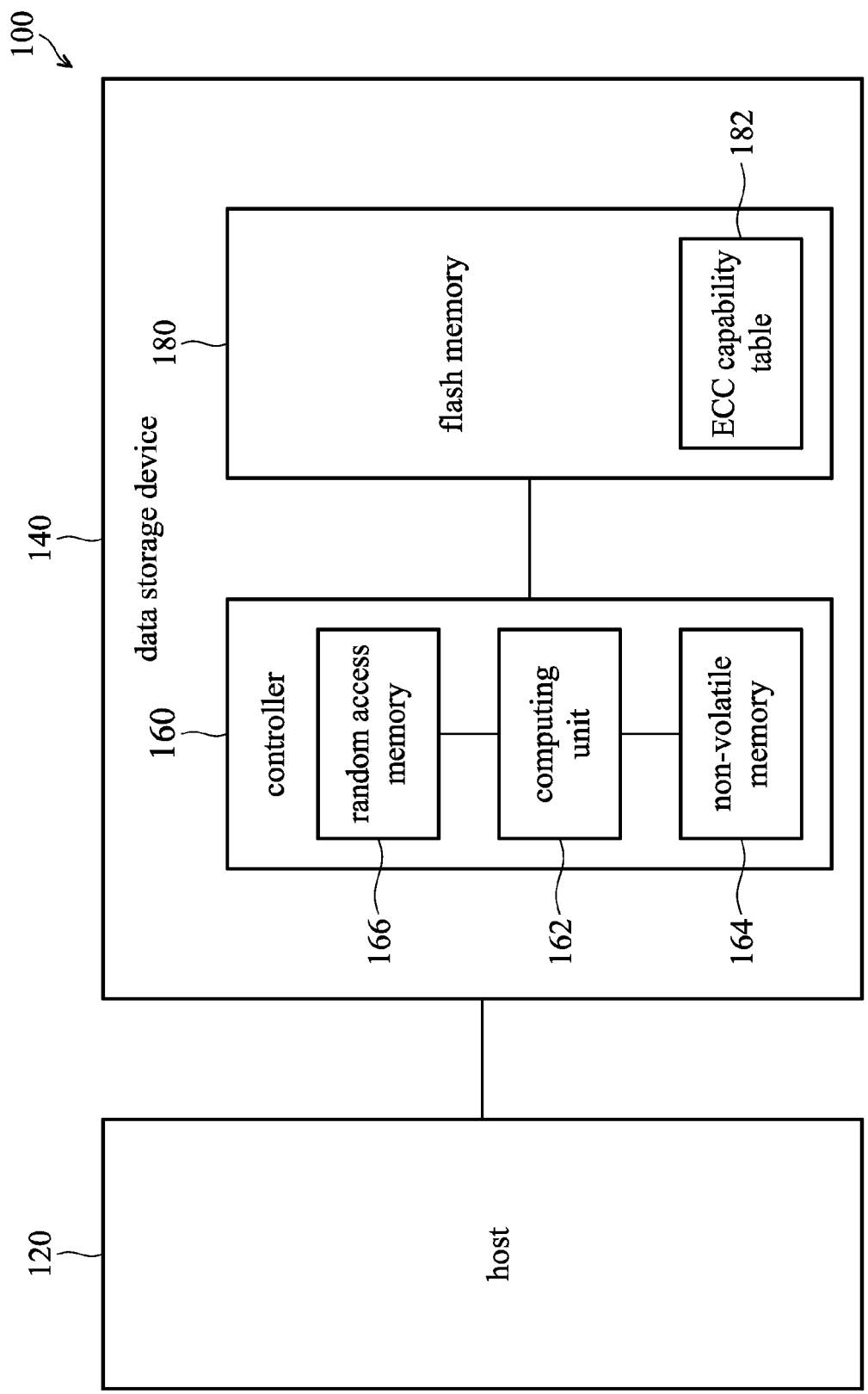
FIG. 1 is a schematic diagram illustrating an embodiment of an electronic system of the present invention.
Figure 2:
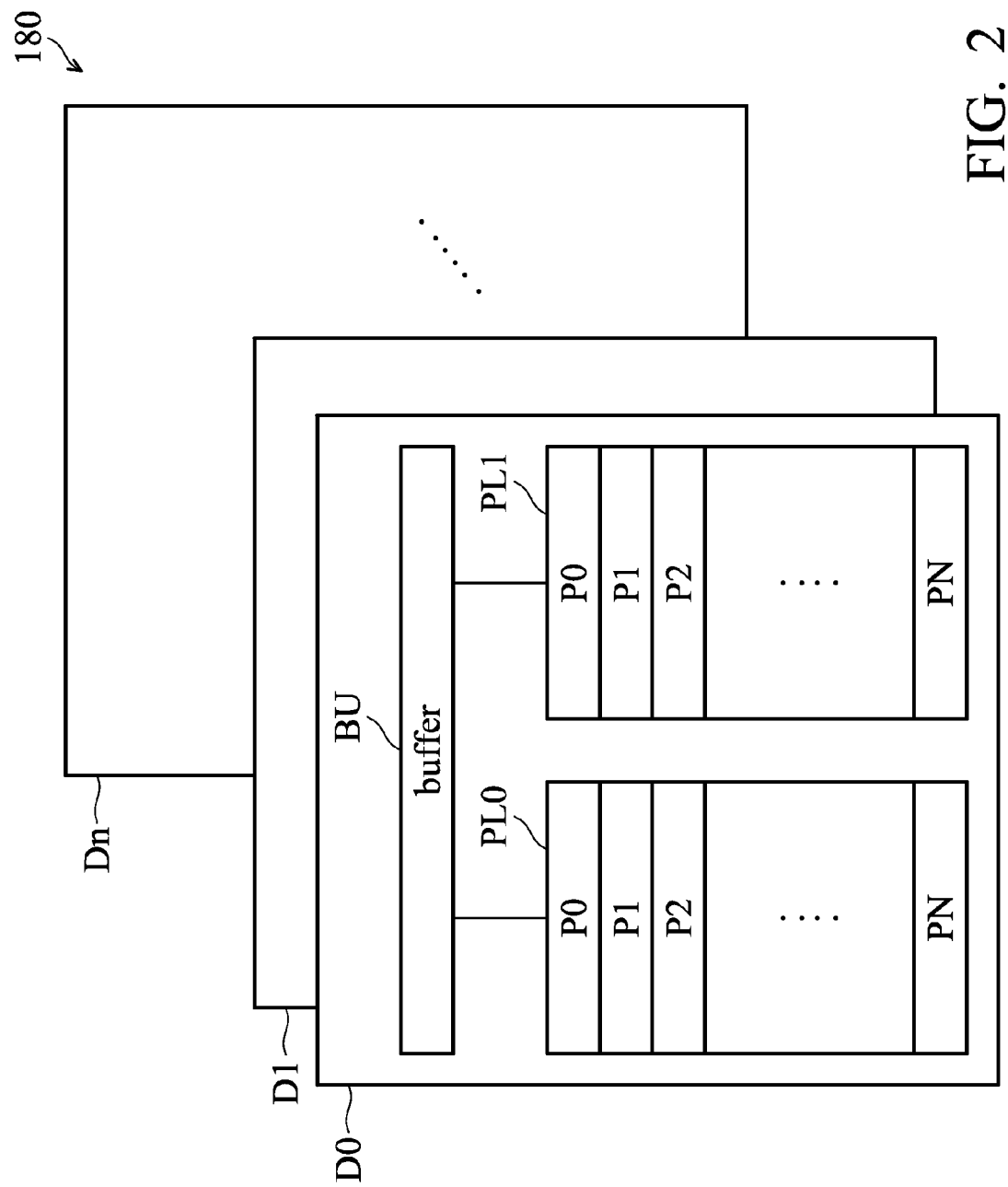
FIG. 2 is a schematic diagram illustrating an embodiment of dies of the present invention.

FIG. 1 is a schematic diagram illustrating an embodiment of an electronic system of the present invention. The electronic system 100 includes a host 12 and a data storage device 140. The data storage device 140 includes a flash memory 180 and a controller 160, and the data storage device 140 can operate in response to the commands of the host 110. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The program codes and parameters can be loaded into the random access memory 166 (RAM) for providing the controller 160 to execute. The flash memory 180 includes a plurality of dies D0~DN, as shown in FIG. 2. Each of the dies D0~DN includes a buffer BU, a first memory plane PL0 and a second memory plane PL1. Each of the first memory plane PL0 and the second memory plane PL1 includes a plurality of pages P0~PN. It should be noted that, in this embodiment, each of the dies D0~DN includes a buffer BU arranged to buffer the data of the first memory plane PL0 and the second memory plane PL1, but it is not limited thereto. In other embodiment, each of the dies D0~DN may include two buffers, wherein the first buffer is arranged to buffer the data of the first memory plane PL0 and the second buffer is arranged to buffer the data of the second memory plane PL1.

In the production process of the flash memory, at least one column of memory cells may be damaged due to dust or mask issues, and the data of the damaged column cannot be successfully read, wherein the damaged column is referred to as a bad column. However, the numbers of bad columns of the different memory planes in the same die may be different. The more bad columns a memory plane has, the less usable memory space the memory plane has, wherein the usable memory space affects the error correction capability. More specifically, a better error correction capability requires more memory space to store the longer parity code. It should be noted that error correction is also referred to as ECC.

Figure 3:
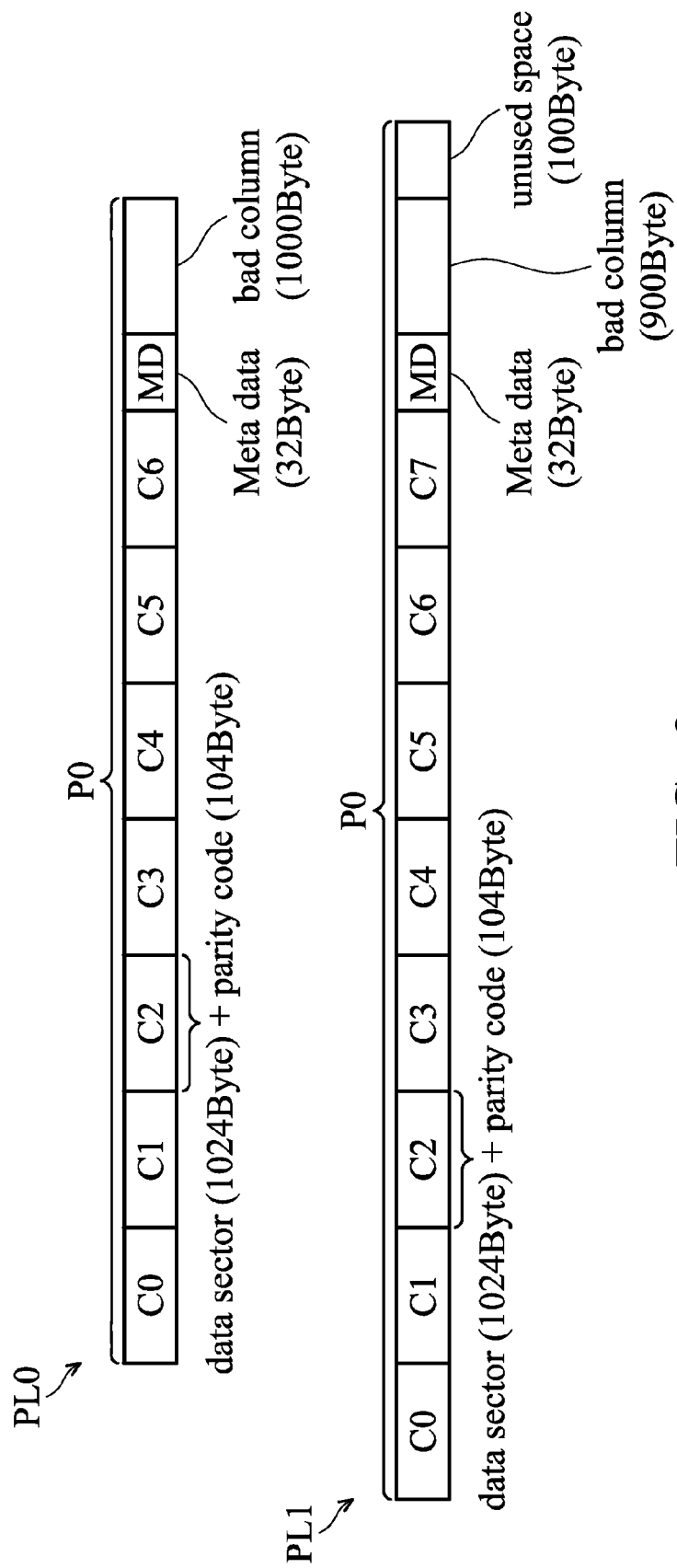
FIG. 3 is a schematic diagram illustrating an embodiment of pages of the present invention.

FIG. 3 is a schematic diagram illustrating an embodiment of pages of the present invention. In this embodiment, each of the pages of the first memory plane PL0 has 1000 bytes of unusable memory space of bad columns and each of the pages of the second memory plane PL1 has 900 bytes of unusable memory space of bad columns. It should be noted that unusable memory space of the bad columns are shown in the end of the page P0 in FIG. 3, but actually the unusable memory of the bad columns are randomly distributed in the pages. In this embodiment, the product developer designs that the first memory plane PL0 and the second memory plane PL1 has the same ECC capability value, wherein the number of bad columns of the first memory plane PL0 is different from the number of bad columns of the second memory plane PL1, and the first memory plane PL0 and the second memory plane PL1 are in the same die. For example, the ECC capability value of the first memory plane PL0 and the ECC capability value of the second memory plane PL1 are 59 Bits, wherein the ECC capability value which is 59 bits requires 104 bytes of parity code. Taking the page P0 of the first memory plane PL0 and the page P0 of the second memory plane PL1 for example, each of the page P0 of the first memory plane PL0 and the page P0 of the second memory plane PL1 has seven chunks C0~C6 and a meta data MD. Each of the chunks C0~C6 has a data sector and a parity code. The data sector is 1024 bytes long. The parity code is 104 bytes long. The Meta data MD is 32 bytes long. As shown in FIG. 3, although the number of bad columns of the second memory plane PL1 is less than the number of bad columns of the first memory plane PL0, the ECC capability of the second memory plane PL1 is the same as the first memory plane PL0 due to the pairing of the ECC capability of the first memory plane PL0. Therefore, 100 bytes of usable memory space of each of the pages of the second memory plane PL1 is wasted. It should be noted that the number of bad columns, the length of Meta data MD, the length of the data sector, and the ECC capability above are an embodiment of the present invention, but it is not limited thereto. The different memory planes may have different bad columns based on different production environments. The number of chunks of a page, the ECC capability value and the length of the data sector can be determine by the product developer, wherein the length of the Meta data MD is determined by the ECC capability and the type of error correction.

Figure 4:
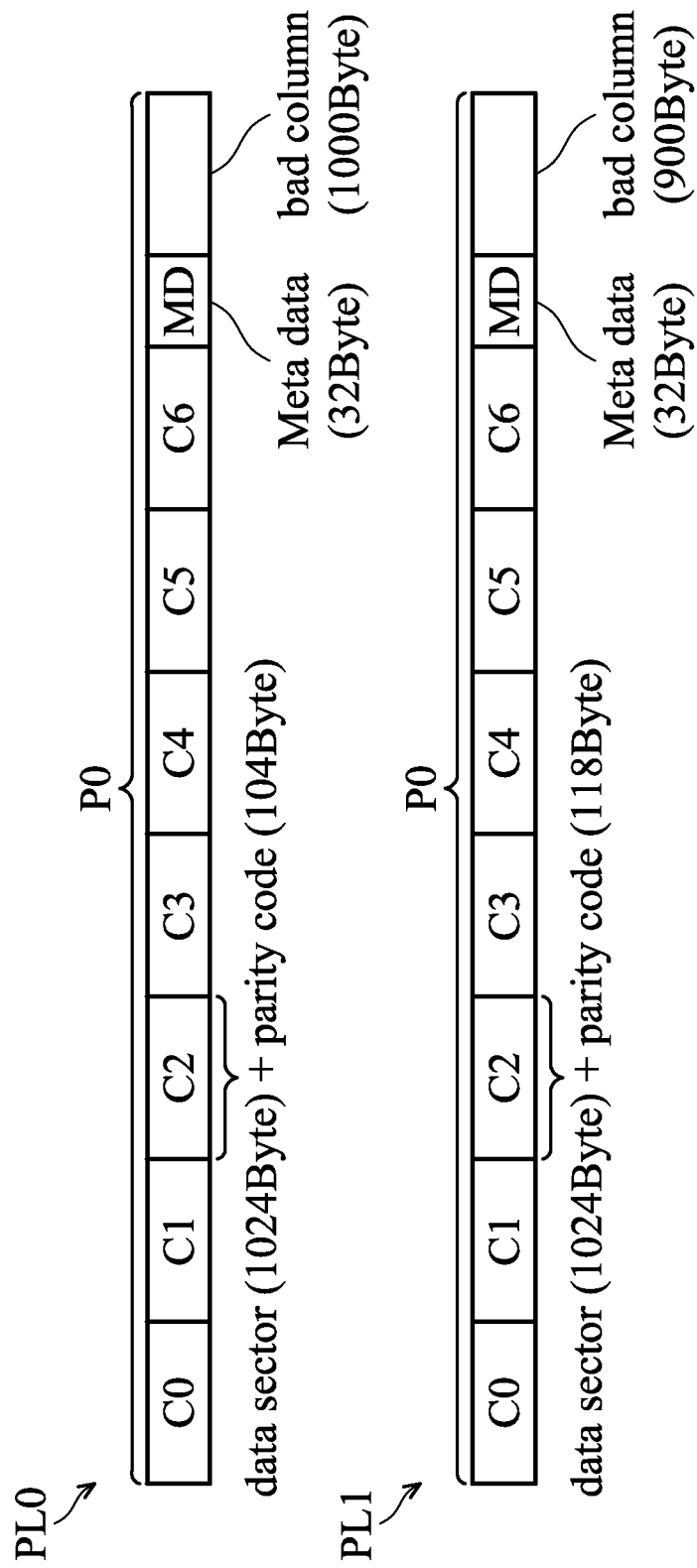
FIG. 4 is a schematic diagram illustrating another embodiment of pages of the present invention.

FIG. 4 is a schematic diagram illustrating another embodiment of pages of the present invention. In this embodiment, each of the pages of the first memory plane PL0 has 1000 bytes of unusable memory space of bad columns, and each of the pages of the second memory plane PL1 has 900 bytes of memory space of the bad columns. It should be noted that unusable memory space of the bad columns are shown in the end of the page P0 in FIG. 4, but actually the unusable memory of the bad columns are randomly distributed in the pages. In this embodiment, the ECC capability value of the first memory plane PL0 and the ECC capability value of the second memory plane PL1 are respectively determined based on the number of bad columns of the first memory plane PL0 and the number of bad columns of the second memory plane PL1. The first memory plane PL0 has a first ECC capability value and the second memory plane PL1 has a second ECC capability value. Moreover, the first memory plane PL0 and the second memory plane PL1 have different error correction capability values from each other, such that the length of the parity code of the first memory plane PL0 and the length of the parity code of the second memory plane PL1 are different. Namely, the length of the parity code of the first memory plane PL0 is a first length, and the length of the parity code of the second memory plane PL1 is a second length, wherein the first length is different from the second length. For example, in this embodiment, the ECC capability value of the first memory plane PL0 is 59 bits, the second ECC capability value of the second memory plane PL1 is 67 bits, but it is not limited thereto. The parity code produced by the ECC capability value which is 59 bits is 104 bytes. The parity code produced by the ECC capability value which is 67 bits is 118 bytes. Taking the page P0 of the first memory plane PL0 and the page P0 of the second memory plane PL1 for example, each of the page P0 of the first memory plane PL0 and the page P0 of the second memory plane PL1 has seven chunks C0~C6 and a Meta data MD. Each of the chunks C0~C6 has a data sector and a parity code. In the first memory plane PL0, the data sector is 1024 bytes long, the parity code is 104 bytes long, and the Meta data MD is 32 bytes long. In the second memory plane PL1, the data sector is 1024 bytes long, the parity code is 118 bytes long and the Meta data MD is 32 bytes long. As shown in FIG. 4, the second memory plane PL1 which has less number of bad columns has more memory space to store the longer parity code with better error correction capability. Therefore, the efficiency of memory space use is higher than the embodiment of FIG. 3. It should be noted that the number of bad columns, the length of the Meta data MD, the length of data sector and the ECC capability value above is one of the embodiments of the present invention, but it is not limited thereto. The different memory planes may have different bad columns based on different production environments. The number of chunks of a page, the ECC capability value and the length of the data sector can be determine by the product developer, wherein the length of the Meta data MD is determined by the ECC capability and the type of error correction.

In the embodiment of FIG. 4, the flash memory 180 further includes an ECC capability table 182, wherein the ECC capability table 182 is arranged to record the first ECC capability value of the first memory plane PL0 and the second ECC capability value of the second memory plane PL1. When the data storage device 140 is started (powered on), the controller 160 is configured to load the ECC capability table 182 into the random access memory 166 to perform error correction and encode the data of the pages of the first memory plane PL0 and the second memory plane PL1 according to the ECC capability table 182 stored in the random access memory 166. Namely, in the read operation, the controller 160 is configured to perform error correction on the pages of the first memory plane PL0 and the second memory plane PL1 according to the ECC capability table 182. In the write operation, the controller 160 is configured to encode the data arranged to be stored into the pages of the first memory plane PL0 and the second memory plane PL1 according to the ECC capability table 182 to obtain the parity codes, and write the obtained parity codes and the corresponding data into the first memory plane PL0 and the second memory plane PL1, wherein the parity code arranged to be stored into the first memory plane PL0 is different from the parity code arranged to be stored into the second memory plane PL1.

In one embodiment, the controller 160 has an error correction engine (not shown). In this embodiment, the error correction engine can perform error correction with different ECC capability values. For example, when the controller 160 receives a read command, the controller 160 determines whether the read command is a first read command arranged to read the data of the first memory plane PL0 or a second read command arranged to read the data of the second memory plane PL1 according to the address included in the read command. When the read command is the first read command which is arranged to read the first memory plane PL0, the controller 160 is configured to transmit the first ECC capability value of the first memory plane PL0 of the ECC capability table 182 stored in the random access memory 166 to the error correction engine in response to the first read command, such that the error correction engine can perform error correction on the data of pages of the first memory plane PL0 based on the first ECC capability value. When the read command is the second read command which is arranged to read the second memory plane PL1, the controller 160 is configured to transmit the second ECC capability value of the second memory plane PL1 of the ECC capability table 182 stored in the random access memory 166 to the error correction engine in response to the second command, such that the error correction engine can perform error correction on the data of the pages of the second memory plane PL1 according to the second ECC capability value. Similarly, when the controller 160 receives a write command, the controller 160 determine whether the data of write command is arranged to be written into the first memory plane PL0 or the second memory plane PL1. When the data is determined to be written into the first memory plane PL0, the controller 160 is configured to transmit the first ECC capability value of the first memory plane PL0 of the ECC capability table 182 stored in the random access memory 166 to the error correction engine in response to the first read command, such that the error correction engine can encode the data based on the first ECC capability value to obtain the parity code(s) of the data and write the obtained parity code and data into the first memory plane PL0. When the data is determined to be written into the second memory plane PL1, the controller 160 is configured to transmit the second ECC capability value of the second memory plane PL1 of the ECC capability table 182 stored in the random access memory 166 to the error correction engine in response to the second command, such that the error correction engine can encode the data based on the second ECC capability value to obtain the parity code(s) of the data and write the obtained parity code and data into the second memory plane PL1.

In another embodiment, the controller 160 further includes a first error correction engine (not shown) and a second error correction engine (not shown), wherein the first error correction engine is capable of performing the error correction with the first ECC capability value, and the second error correction engine is capable of performing the error correction with the second ECC capability value. Namely, the first error correction engine is arranged to encode and correct data of the first memory plane PL0, and the second error correction engine is arranged to encode and correct data of the second memory plane PL1. In this embodiment, the controller 160 is configured to assign the data of the first memory plane PL0 to the first error correction engine to be corrected and encoded and assign the data of the second memory plane PL1 to the second error correction engine to be corrected and encoded according to the ECC capability table 182. For example, when the controller 160 receives a read command, the controller 160 determines whether the read command is a first command arranged to read the data of the first memory plane PL0 or a second command arranged to read the data of the second memory plane PL1. When the read command is the first read command which is arranged to read the first memory plane PL0, the controller 160 is configured to transmit the first ECC capability value of the first memory plane PL0 of the ECC capability table 182 stored in the random access memory 166 to the first error correction engine in response to the first read command, such that the first error correction engine can perform error correction (decode) on the data of pages of the first memory plane PL0 based on the first ECC capability value. When the read command is the second read command which is arranged to read the second memory plane PL1, the controller 160 is configured to transmit the second ECC capability value of the second memory plane PL1 of the ECC capability table 182 stored in the random access memory 166 to the second error correction engine in response to the second command, such that the second error correction engine can perform error correction (decode) on the data of the pages of the second memory plane PL1 according to the second ECC capability value. Similarly, when the controller 160 receives a write command, the controller 160 determine whether the data of write command is arranged to be written into the first memory plane PL0 or the second memory plane PL1. When the data is determined to be written into the first memory plane PL0, the controller 160 is configured to transmit the first ECC capability value of the first memory plane PL0 of the ECC capability table 182 stored in the random access memory 166 to the first error correction engine in response to the first read command, such that the first error correction engine can encode the data based on the first ECC capability value to obtain the parity code(s) of the data and write the obtained parity code and data into the first memory plane PL0. When the data is determined to be written into the second memory plane PL1, the controller 160 is configured to transmit the second ECC capability value of the second memory plane PL1 of the ECC capability table 182 stored in the random access memory 166 to the second error correction engine in response to the second command, such that the second error correction engine can encode the data based on the second ECC capability value to obtain the parity code(s) of the data and write the obtained parity code and data into the second memory plane PL1.

Figure 5:
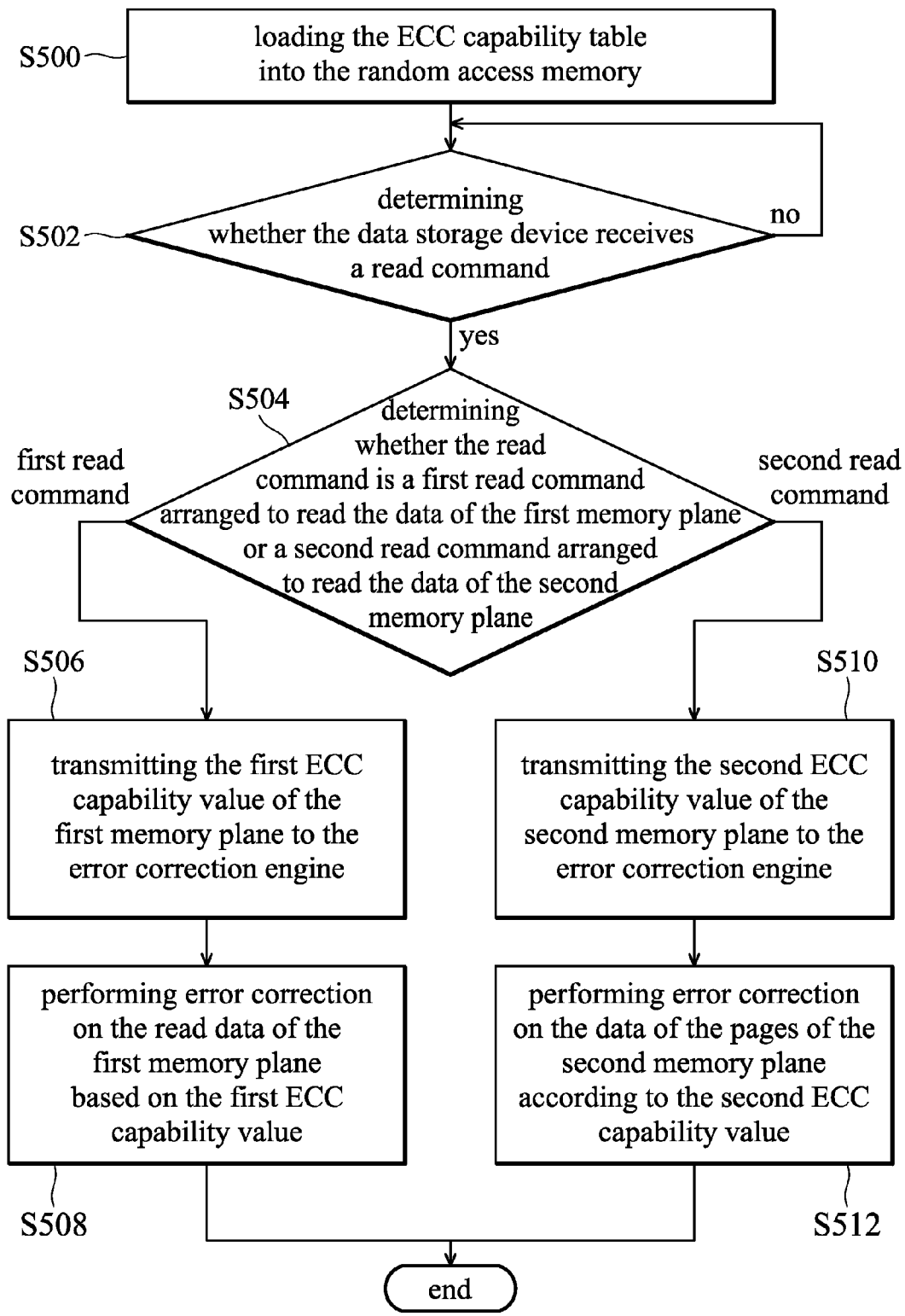
FIG. 5 is a flowchart of an error correction method according to an embodiment of the present invention.

FIG. 5 is a flowchart of an error correction method according to an embodiment of the present invention. The error correction method is applied to the electronic system 100 of FIG. 1. The process starts at step S500. The product developer can define the first ECC capability of the first memory plane PL0 and the second ECC capability of the second memory plane PL1 according to the number of bad columns of the first memory plane PL0 and the number of bad columns of the second memory plane PL1 respectively before step S500. Moreover, in this embodiment, the controller 160 has only one error correction engine (not shown), and the error correction engine can perform error correction with different ECC capability values.

In step S500, the controller 160 is configured to load the ECC capability table 182 into the random access memory 166 when the data storage device 140 is started, wherein the ECC capability table 182 is arranged to record the first ECC capability value of the first memory plane PL0 and the second ECC capability value of the second memory plane PL1.

Next, in step S502, the controller 160 determines whether the data storage device 140 receives a read command from the host 120. When the data storage device 140 receives a read command from the host 120, the process goes to step S504, otherwise, the controller 160 continues to determine whether the data storage device 140 receives a read command from the host 120.

In step S504, the controller 160 determines whether the read command is a first read command arranged to read the data of the first memory plane PL0 or a second read command arranged to read the data of the second memory plane PL1 according to the address included in the read command. When the read command is the first read command, the process goes to step S506. When the read command is the second read command, the process goes to step S510.

In step S506, the controller 160 is configured to transmit the first ECC capability value of the first memory plane PL0 of the ECC capability table 182 stored in the random access memory 166 to the error correction engine.

Next, in step S508, the error correction engine performs error correction on the read data of the first memory plane PL0 based on the first ECC capability value, wherein the error correction engine corrects the data sector of the chunk of the first memory plane PL0 according to the parity code of the same chunk of the first memory plane PL0. The process ends at step S508.

In step S510, the controller 160 is configured to transmit the second ECC capability value of the second memory plane PL1 of the ECC capability table 182 stored in the random access memory 166 to the error correction engine.

Next, in step S512, the error correction engine performs error correction on the data of the pages of the second memory plane PL1 according to the second ECC capability value, wherein the error correction engine corrects the data sector of the chunk of the second memory plane PL1 according to the parity code of the same chunk of the second memory plane PL1. It should be noted that the length of the parity codes of the second memory plane PL1 is different from the length of the parity codes of the first memory plane PL0. The process ends at step S512.

Figure 6:
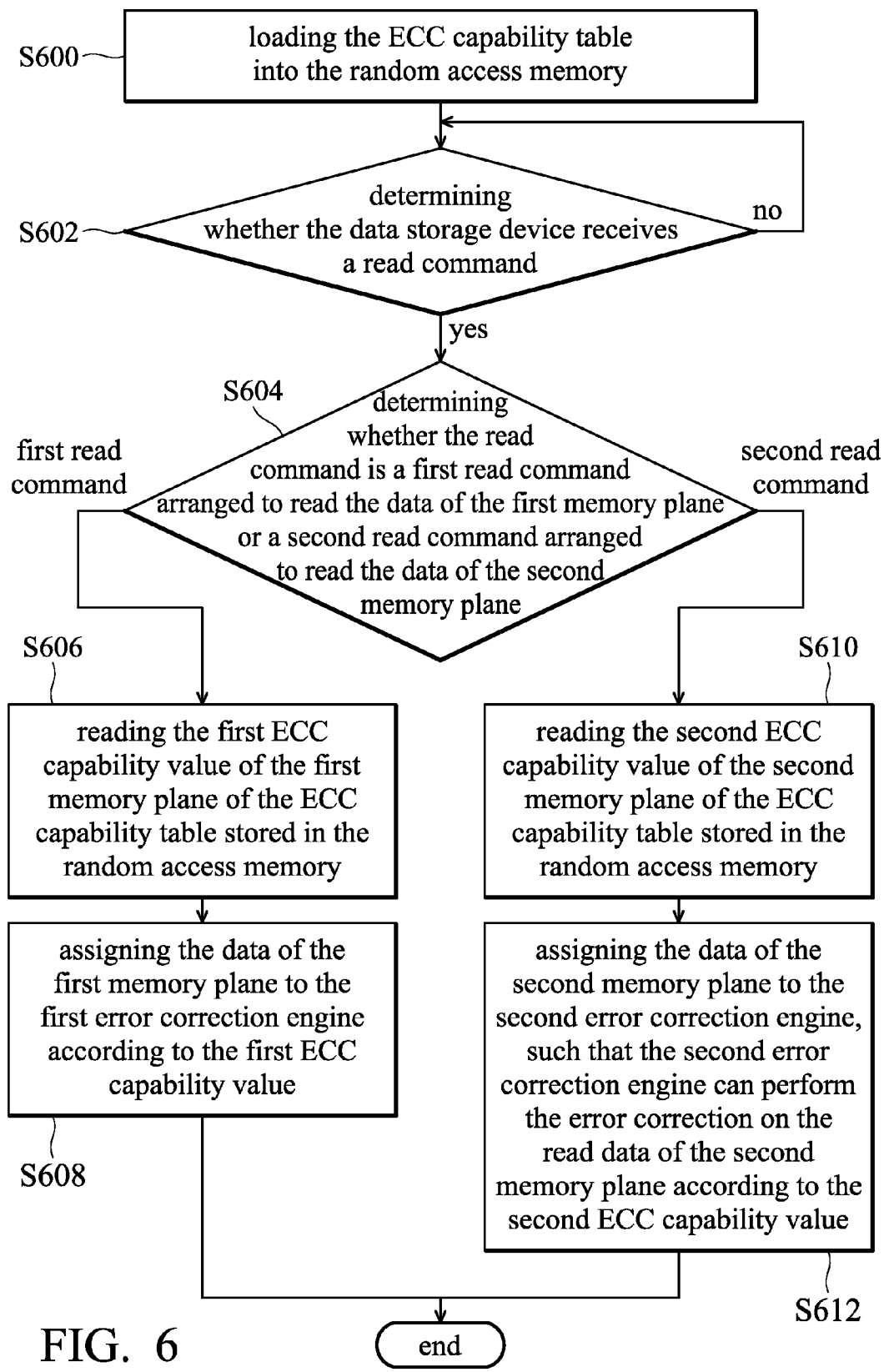
FIG. 6 is a flowchart of an error correction method according to another embodiment of the present invention.

FIG. 6 is a flowchart of an error correction method according to another embodiment of the present invention. The error correction method is applied to the electronic system 100 of FIG. 1. The process starts at step S600. The product developer can respectively define the first ECC capability of the first memory plane PL0 and the second ECC capability of the second memory plane PL1 according to the number of bad columns of the first memory plane PL0 and the number of bad columns of the second memory plane PL1 before step S600. In this embodiment, the controller 160 includes a first error correction engine (not shown) and a second error correction engine (not shown), wherein the first error correction engine is capable of performing the error correction with the first ECC capability value, and the second error correction engine is capable of performing the error correction with the second ECC capability value. It should be noted that steps S600~S604 are similar to steps S500~S504, so the details of steps S600~S604 can be referred to in steps S500~S504 of FIG. 5.

In step S606, the controller 160 reads the first ECC capability value of the first memory plane PL0 of the ECC capability table 182 stored in the random access memory 166.

Next, step S608, the controller 160 assigns the data of the first memory plane PL0 to the first error correction engine according to the first ECC capability value, such that the first error correction engine can perform error correction on (decode) the read data of the first memory plane PL0 according to the first ECC capability value, wherein the error correction engine is arranged to correct the data sector of the chunk of the first memory plane PL0 by using the corresponding parity code of the chunk of the first memory plane PL0. The process ends at step S608.

In step S610, the controller 160 reads the second ECC capability value of the second memory plane PL0 of the ECC capability table 182 stored in the random access memory 166.

Next, in step S612, the controller 160 assigns the data of the second memory plane PL1 to the second error correction engine, such that the second error correction engine can perform the error correction on (decode) the read data of the second memory plane PL0 according to the second ECC capability value, wherein the error correction engine is arranged to correct the data sector of the chunk of the second memory plane PL1 by using the corresponding parity code of the chunk of the second memory plane PL1. The process ends at step S612.

The data storage device 140 and the error correction method of the present invention are capable of correcting the memory planes with different ECC capability values in the same die.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device with error correction capability to minimize unused memory, comprising:
    a flash memory, comprising a plurality of dies, and each of the dies comprises a first memory plane and a second memory plane, wherein the first memory plane and the second memory plane are of equal size, and the first memory plane comprises a plurality of pages having a first number of bad columns and the second memory plane comprises a plurality of pages having a second number of bad columns, and the first number of bad columns is different from the second number of bad columns; and
    a controller, correcting data stored in the first memory plane and the second memory plane according to an ECC capability table, wherein the ECC capability table is arranged to record a first ECC capability value of the first memory plane and a second ECC capability value of the second memory plane, wherein the first ECC capability value is obtained based on a first parity code stored on the first memory plane and the second ECC capability value is obtained based on a second parity code stored on the second memory plane;
    wherein the first parity code has a first length and the second parity code has a second length, and the first length is different from the second length.

2. The data storage device as claimed in claim 1, wherein the controller further comprises a random access memory, and the controller further loads the ECC capability table into the random access memory and corrects data of the first memory plane and the second memory plane according to the ECC capability table of the random access memory.

3. The data storage device as claimed in claim 2, wherein the controller further comprises an error correction engine, wherein the controller transmits the first ECC capability value of the first memory plane of the ECC capability table stored in the random access memory to the error correction engine in response to a first read command arranged to read the first memory plane to allow the error correction engine to correct data of at least one page of the first memory plane according to the first ECC capability value, and the controller transmits the second ECC capability value of the second memory plane of the ECC capability table stored in the random access memory to the error correction engine in response to a second read command arranged to read the second memory plane to allow the error correction engine to correct at least one page of the second memory plane according to the second ECC capability value.

4. The data storage device as claimed in claim 2, wherein the controller further comprises a first error correction engine and a second error correction engine, wherein the first error correction engine is arranged to encode and correct data according to the first ECC capability value, and the second error correction engine is arranged to encode and correct data according to the second ECC capability value.

5. The data storage device as claimed in claim 4, wherein the controller further assigns the data of the first memory plane to the first error correction engine according to the ECC capability table for error correcting and encoding and assigns the data of the second memory plane to the second error correction engine according to the ECC capability table for error correcting and encoding.

6. The data storage device as claimed in claim 1, wherein each of the pages of the first memory plane and the second memory plane comprises a plurality of chunks, each of the chunks comprises a data sector and a parity code, wherein each of the parity codes of the first memory plane has a first length, each of the parity codes of the second memory plane has a second length, and the first and second lengths are different.

7. An error correction method, applied to a data storage device with error correction capability to minimize unused memory, wherein the data storage device comprises a flash memory, the flash memory comprises a plurality of dies, and each of the dies comprises a first memory plane and a second memory plane, wherein the first memory plane and the second memory plane are of equal size, and each of the first memory plane comprises a plurality of pages having a first number of bad columns, and the second memory plane comprises a plurality of pages having a second number of bad columns, and the first number of bad columns is different from the second number of bad columns, the error correction method comprising:
correcting data of at least one page of the first memory plane according to a first ECC capability value; and
correcting data of at least one page of the second memory plane according to a second ECC capability value, wherein the first ECC capability value is obtained based on a first parity code stored on the first memory plane and the second ECC capability value is obtained based on a second parity code stored on the second memory plane;
wherein the first parity code has a first length and the second parity code has a second length, and the first length is different from the second length.

8. The error correction method as claimed in claim 7, further comprising:
loading an ECC capability table into a random access memory;
transmitting the first ECC capability value of the first memory plane of the ECC capability table stored in the random access memory to an error correction engine in response to a first read command arranged to read the first memory plane; and
transmitting the second ECC capability value of the second memory plane of the ECC capability table stored in the random access memory to the error correction engine in response to a second read command arranged to read the second memory plane.

9. The error correction method as claimed in claim 7, further comprising:
loading an ECC capability table into a random access memory, wherein the ECC capability table is arranged to record the first ECC capability value of the first memory plane and the second ECC capability value of the second memory plane;
assigning the data of the first memory plane to a first error correction engine according to the ECC capability table for error correcting and encoding; and
assigning the data of the second memory plane to the second error correction engine according to the ECC capability table for error correcting and encoding.

10. The error correction method as claimed in claim 7, wherein each of the pages of the first memory plane and the second memory plane comprises a plurality of chunks, each of the chunks comprises a data sector and a parity code, wherein the error correction method further comprises:
correcting the data sectors of the chunks of the first memory plane according to the parity codes of the chunks of the first memory plane; and
correcting the data sectors of the chunks of the second memory plane according to the parity codes of the chunks of the second memory plane, wherein each of the parity codes of the first memory plane has a first length, each of the parity codes of the second memory plane has a second length, and the first and second lengths are different.

11. The error correction method as claimed in claim 7, further comprising defining the first ECC capability value of the first memory plane according to bad columns of the first memory plane and defining the second ECC capability value of the second memory plane according to bad columns of the second memory plane.

* * * * *